(12) United States Patent
Takigashira et al.

(10) Patent No.: US 11,835,552 B2
(45) Date of Patent: Dec. 5, 2023

(54) ELECTRIC CURRENT DETECTION DEVICE AND ELECTRIC CURRENT DETECTION METHOD

(71) Applicants: NISSAN MOTOR CO., LTD., Yokohama (JP); RENAULT S.A.S., Boulogne-Billancourt (FR)

(72) Inventors: Naoki Takigashira, Kanagawa (JP); Masanori Yamashita, Kanagawa (JP); Kouichi Matsuda, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/927,075

(22) PCT Filed: May 28, 2020

(86) PCT No.: PCT/IB2020/000514
§ 371 (c)(1),
(2) Date: Nov. 22, 2022

(87) PCT Pub. No.: WO2021/240192
PCT Pub. Date: Dec. 2, 2021

(65) Prior Publication Data
US 2023/0204631 A1  Jun. 29, 2023

(51) Int. Cl.
*G01R 19/00* (2006.01)
*G01R 15/14* (2006.01)

(52) U.S. Cl.
CPC ....... *G01R 19/0092* (2013.01); *G01R 15/146* (2013.01)

(58) Field of Classification Search
CPC .......................... G01R 19/0092; G01R 15/146
See application file for complete search history.

(56) References Cited

U.S. PATENT DOCUMENTS

| | | | | |
|---|---|---|---|---|
| 5,920,189 A | * | 7/1999 | Fisher | .................... G01R 15/09 |
| | | | | 324/130 |
| 8,861,232 B2 | * | 10/2014 | Ikeda | ................. G01R 19/0092 |
| | | | | 363/55 |
| 11,029,338 B2 | * | 6/2021 | Kaya | ..................... G01R 1/203 |
| 2003/0071673 A1 | | 4/2003 | Jordanger et al. | |
| 2007/0152753 A1 | | 7/2007 | Swanson | |

(Continued)

FOREIGN PATENT DOCUMENTS

CN  203551651 U  4/2014
CN  109813957 A  5/2019

(Continued)

*Primary Examiner* — Dominic E Hawkins
(74) *Attorney, Agent, or Firm* — Foley & Lardner LLP (57) ABSTRACT

A current detection device (100) includes a shunt resistor (1) connected in series to a path through which a current flows; a first circuit (2) that converts a voltage across the shunt resistor (1) into a predetermined differential voltage; a second circuit (3) to which the predetermined differential voltage is input from the first circuit (2) via a pair of wirings (55) and that amplifies the predetermined differential voltage; a constant current circuit (4) connected between the pair of wirings (55); and an arithmetic circuit (5) that operates the current flowing through the path based on the voltage amplified by the second circuit (3).

16 Claims, 3 Drawing Sheets

(56) References Cited

U.S. PATENT DOCUMENTS

| | | |
|---|---|---|
| 2010/0045263 A1 | 2/2010 | Cadoux et al. |
| 2010/0327887 A1 | 12/2010 | Denison et al. |
| 2012/0048520 A1 | 3/2012 | Ikeda et al. |
| 2013/0057275 A1* | 3/2013 | Tamura ................ B60L 3/0038 324/252 |
| 2015/0219690 A1* | 8/2015 | Kaya .................. G01R 19/0092 324/126 |
| 2016/0341772 A1* | 11/2016 | Roberts ................ G01R 35/005 |
| 2017/0089955 A1* | 3/2017 | Yugou .................... B60L 3/0038 |
| 2018/0097490 A1 | 4/2018 | Mengad et al. |
| 2019/0227104 A1* | 7/2019 | Nakamura ............. H01C 13/00 |

FOREIGN PATENT DOCUMENTS

| | | |
|---|---|---|
| JP | 2010-249751 A | 11/2010 |
| JP | 2011-064532 A | 3/2011 |
| JP | 2012-117929 A | 6/2012 |
| JP | 2015-222176 A | 12/2015 |

\* cited by examiner

ELECTRIC CURRENT DETECTION DEVICE AND ELECTRIC CURRENT DETECTION METHOD

TECHNICAL FIELD

The present invention relates to a current detection device and a current detection method.

BACKGROUND ART

As a current detection device using an operational amplifier, there has been known a current detection device that includes a shunt resistor, an operational amplifier, a low-pass filter, and an operator (for example, Patent Document 1). The shunt resistor is connected in series to a path through which a current flows. The operational amplifier amplifies a voltage across the shunt resistor at a predetermined amplification factor. The low-pass filter averages output voltages from the operational amplifier. The operator operates a current flowing through the path based on the voltage output from the low-pass filter. In this current detection device, a power supply voltage of the operational amplifier is set to be higher than a power supply voltage of the operator, and the low-pass filter averages the output voltages from the operational amplifier so as to be a value lower than the power supply voltage of the operator.

Patent Document 1: JP-A-2010-249751

DISCLOSURE OF THE INVENTION

Problems to be Solved by the Invention

In the current detection device of Patent Document 1, by configuring the power supply voltage of the operational amplifier to be higher than the power supply voltage of the operator, the output voltage range of the operational amplifier is expanded to enhance detection accuracy of the current. That is, the current detection device of Patent Document 1 includes a plurality of types of power supplies having voltages at different heights to enhance the detection accuracy of the current. This causes a problem of difficulty in increasing the detection accuracy of the current without disposing the plurality of types of power supplies having the voltages at different heights.

A problem solved by the present invention is to provide a current detection device and a current detection method that allow increasing detection accuracy of a current without disposing a plurality of types of power supplies having voltages at different heights.

Solutions to the Problems

The present invention includes a shunt resistor, a first circuit, a second circuit, a constant current circuit, and an arithmetic circuit. The shunt resistor is connected in series to a path through which a current flows. The first circuit converts a voltage across the shunt resistor into a predetermined differential voltage. To the second circuit, the predetermined differential voltage is input from the first circuit via a pair of wirings. The second circuit amplifies the predetermined differential voltage. The constant current circuit is connected between the pair of wirings. The arithmetic circuit operates a current flowing through the path based on the voltage amplified by the second circuit. Thus, the present invention solves the above-described problem.

Effects of the Invention

According to the present invention, since an output voltage range of the differential amplifier circuit can be adjusted by the constant current circuit, the present invention allows increasing detection accuracy of a current without disposing a plurality of types of power supplies having voltages at different heights.

DESCRIPTION OF PREFERRED EMBODIMENTS

The following describes embodiments of the present invention with reference to the drawings.

Figure 1:
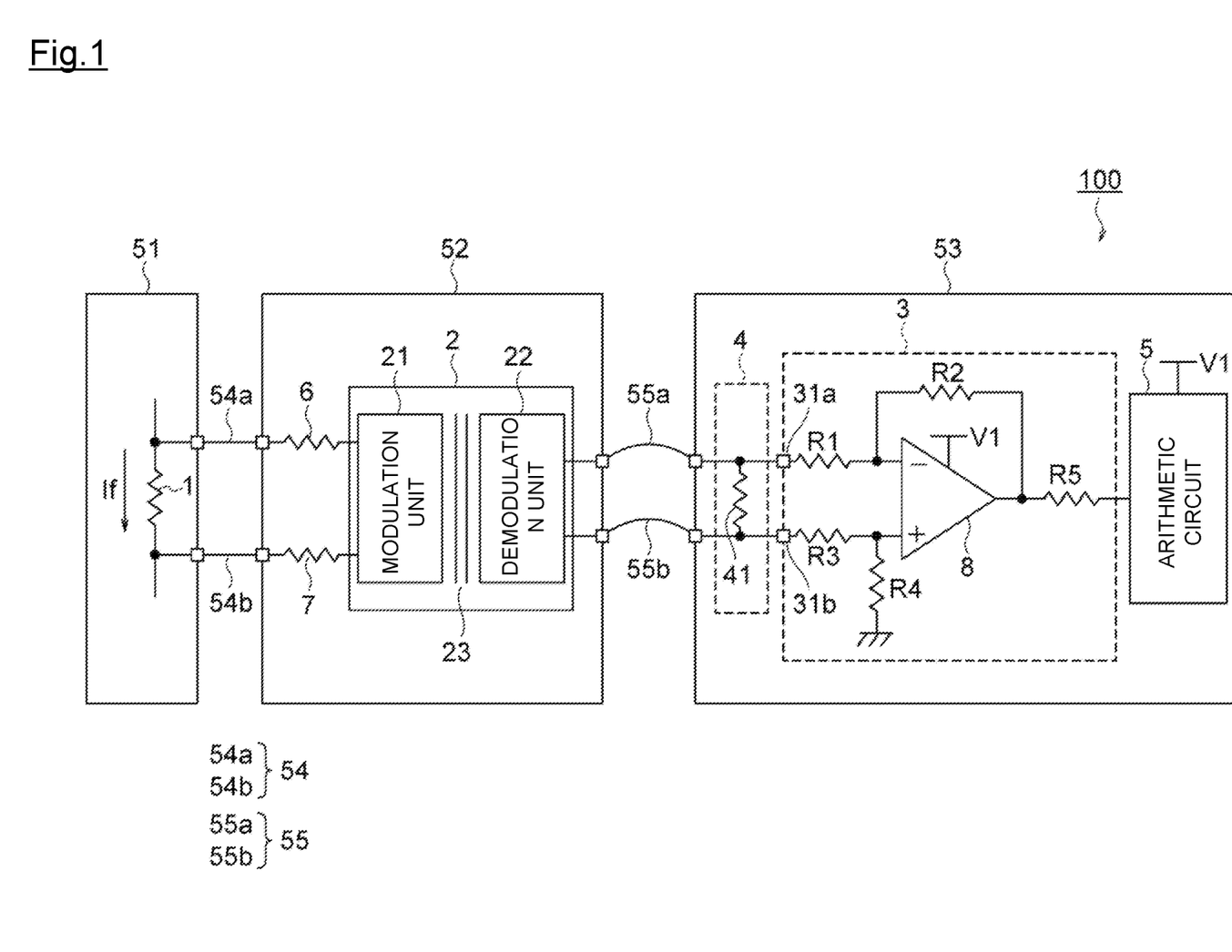
FIG. 1 is a block diagram illustrating a current detection device according to an embodiment.

FIG. 1 is a block diagram of a current detection device 100 according to an embodiment. The current detection device 100 is, for example, disposed in an electric vehicle including a motor as a traveling driving source. The electric vehicle includes an inverter to drive the motor, and the current detection device 100 measures a value of a current (hereinafter referred to as a current value) flowing from the inverter to the motor. Note that a device in which the current detection device 100 is disposed is not especially limited, and may be other than the electric vehicle. The type of the current measured by the current detection device 100 is not limited to the current flowing from the inverter to the motor, and the current detection device 100 may measure another current value.

As illustrated in FIG. 1, the current detection device 100 includes three substrates from a substrate 51 to a substrate 53. Each substrate includes, for example, an element, a component, or a circuit described later.

The substrate 51 and the substrate 52 are connected with a pair of connection bodies 54. The connection bodies 54 include a connection body 54a and a connection body 54b. The substrate 52 and the substrate 53 are connected with a pair of connection bodies 55. The connection bodies 55 include a connection body 55a and a connection body 55b. The connection body 54 and the connection body 55 only need to be wiring bodies that can connect between the substrates, and the length, the material, the configuration, and the like of the connection body are not specifically limited in this embodiment. As the connection body 54 and the connection body 55, for example, harness connectors are used.

The current detection device 100 includes a shunt resistor 1, an insulation circuit 2, a differential amplifier circuit 3, a constant current circuit 4, and an arithmetic circuit 5. Hereinafter, the element, the component, and the circuit constituting the current detection device 100 will be described.

The shunt resistor 1 is disposed in the substrate 51. The shunt resistor 1 is connected in series to a path through which a current If flows and is a resistor for current detection for detecting the current If. The shunt resistor 1 functions as a detection unit for detecting the current If. In FIG. 1, the current If flows from the top to the bottom of the drawing. A voltage across the shunt resistor 1 is applied to the insulation circuit 2 via the connection bodies 54. Note that the resistance value, the structure, the magnitude, and the like of the shunt resistor 1 are not especially limited, and the shunt resistor 1 is selected according to the device in which the current detection device 100 is disposed.

The insulation circuit 2 is disposed in the substrate 52. To the insulation circuit 2, a voltage across the shunt resistor 1 is input via the connection bodies 54. Input resistors 6, 7 are disposed between the connection bodies 54 and the insulation circuit 2. The input resistor 6 is connected in series between the connection body 54*a* and the insulation circuit 2, and the input resistor 7 is connected in series between the connection body 54*b* and the insulation circuit 2.

The insulation circuit 2 converts the voltage across the shunt resistor 1 into a predetermined differential voltage. In the example of FIG. 1, the insulation circuit 2 generates the predetermined differential voltage based on the voltage across the shunt resistor 1 input from the substrate 51 via the connection bodies 54. The insulation circuit 2 outputs the differential voltage to the differential amplifier circuit 3 via the connection bodies 55. At the differential voltage, the voltage of the connection body 55*a* is higher than the voltage of the connection body 55*b*.

As illustrated in FIG. 1, the insulation circuit 2 includes a modulation unit 21 and a demodulation unit 22. The modulation unit 21 is electrically insulated from the demodulation unit 22, and the insulation circuit 2 has a configuration that cannot transmit a direct current signal between the modulation unit 21 and the demodulation unit 22.

The modulation unit 21 includes a modulation circuit that modulates the voltage across the shunt resistor 1 to predetermined signals. The modulation circuit generates a modulation signal according to the current If. The signal modulated by the modulation circuit is transmitted to the demodulation unit 22.

The demodulation unit 22 includes a demodulation circuit that generates a differential voltage based on the signal transmitted from the modulation unit 21. The demodulation circuit outputs the generated differential voltage. Since the modulation unit 21 is insulated from the demodulation unit 22, the demodulation unit 22 can generate a differential voltage not affected by the voltage across the shunt resistor 1. That is, the insulation circuit 2 can generate a differential voltage as a minute signal regardless of the height of the voltage across the shunt resistor 1.

In this embodiment, the signal transmitted from the modulation unit 21 to the demodulation unit 22 is an alternating current signal, and the modulation unit 21 is AC coupled to the demodulation unit 22 by a capacitor 23 (AC coupling). The alternating-current component in the voltage based on the voltage across the shunt resistor 1 is transmitted to the demodulation unit 22 from the modulation unit 21 via the capacitor 23.

For example, the modulation unit 21 performs modulation to a predetermined alternating current signal based on the voltage across the shunt resistor 1. The modulated alternating current signal is transmitted to the demodulation unit 22. The demodulation unit 22 converts the alternating current signal into a direct current signal and generates the differential voltage based on the direct current signal. The differential voltage generated by the demodulation unit 22 is output to the differential amplifier circuit 3 via the connection bodies 55. Note that as the modulation circuit of the modulation unit 21 and the demodulation circuit of the demodulation unit 22, a modulation circuit and a demodulation circuit that have been known as of the filing of the present application and can transmit the alternating current signal by the AC coupling are applicable, respectively. Additionally, while FIG. 1 representatively illustrates one capacitor 23, the number of capacitors 23 can be changed according to the respective circuit configurations of the modulation circuit of the modulation unit 21 and the demodulation circuit of the demodulation unit 22.

The differential amplifier circuit 3 is disposed in the substrate 53. To the differential amplifier circuit 3, a differential voltage is input via the connection bodies 55. The differential amplifier circuit 3 includes an operational amplifier 8 that amplifies the input differential voltage at a predetermined amplification factor. The operational amplifier 8 operates at a power supply voltage V1 (for example, 5 V). The differential amplifier circuit 3 outputs the amplified voltage to the arithmetic circuit 5. The amplification factor of the differential amplifier circuit 3 is configured according to a resistor R1 to a resistor R4. Note that as the differential amplifier circuit 3, a differential amplifier circuit known as of the filing of the present application is applicable.

As illustrated in FIG. 1, in the substrate 53, a constant current circuit 4 is disposed between the connection bodies 55 and the differential amplifier circuit 3. In the substrate 53, a pair of differential wirings electrically conductive to the connection bodies 55 are disposed. The differential voltage output from the insulation circuit 2 is input to the differential amplifier circuit 3 via the connection bodies 55 and the differential wirings. The constant current circuit 4 flows a constant current between the differential wirings.

In this embodiment, as the constant current circuit 4, a resistor 41 that connects the differential wirings is used. In view of this, by changing the resistance value of the resistor 41, a current flowing between the differential wirings can be changed. Expressed in another way, by changing the resistance value of the resistor 41, a voltage between an input terminal 31*a* and an input terminal 31*b* of the differential amplifier circuit 3 can be changed. The resistor 41 is a resistor for current adjustment that adjusts the current flowing between the differential wirings. Additionally, with the differential voltage, noise immunity between the insulation circuit 2 and the differential amplifier circuit 3 can be improved.

The arithmetic circuit 5 is a computer for measuring the current If. The arithmetic circuit 5 includes a Read Only Memory (ROM) that stores a program for operating a current value, a Central Processing Unit (CPU) that executes the program stored in the ROM, and a Random Access Memory (RAM) that functions as an accessible storage device. The arithmetic circuit 5 operates at the power supply voltage V1 (for example, 5 V) similarly to the operational amplifier 8. To the arithmetic circuit 5, the voltage amplified by the differential amplifier circuit 3 is input. The arithmetic circuit 5 executes the program stored in the ROM to operate a current value (a digital value) corresponding to the current If based on the voltage from the differential amplifier circuit 3. In other words, the arithmetic circuit 5 generates a digital signal from an analog signal.

Figure 2:
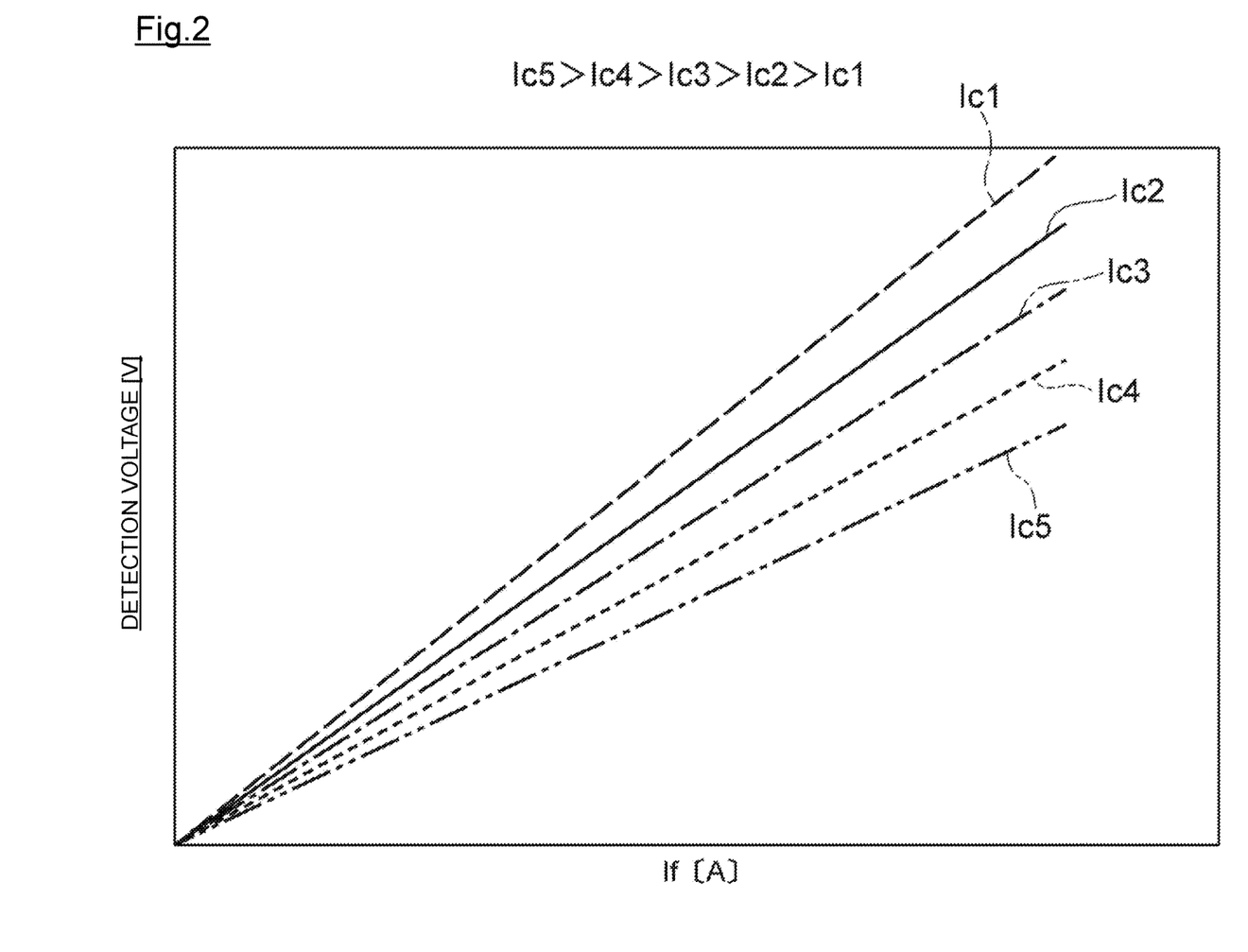
FIG. 2 is characteristics of detection voltages detected by an arithmetic circuit relative to currents flowing through a shunt resistor when a current flowing through a constant current circuit is changed.

Here, with reference to FIG. 2 and FIG. 3, the detection voltage characteristic of the arithmetic circuit 5 will be described. FIG. 2 is characteristics of detection voltages detected by the arithmetic circuit 5 relative to currents flowing through the shunt resistor 1 when a current flowing through the constant current circuit 4 is changed. In FIG. 2, the horizontal axis indicates the current If (unit: [A]) flowing through the shunt resistor 1, and the vertical axis indicates the detection voltage (unit: [V]) detected by the arithmetic circuit 5. In FIG. 2, Ic1 to Ic5 indicate current values flowed by the constant current circuit 4. The current values increase in the order of Ic1 to Ic5.

The arithmetic circuit 5 operates the current value corresponding to the current If based on the detection voltage illustrated in FIG. 2. As illustrated in FIG. 2, the current If and the detection voltage of the arithmetic circuit 5 are in a proportional relation. In view of this, the arithmetic circuit 5 operates the current value to be low as the detection voltage lowers. On the other hand, the arithmetic circuit 5 operates the current value to be high as the detection voltage increases.

Here, using FIG. 2, the relationship between operation accuracy of the arithmetic circuit 5 and the output voltage of the differential amplifier circuit 3 will be described. The operation accuracy of the arithmetic circuit 5 is determined by the inclination of the detection voltage with respect to the current If illustrated in FIG. 2. When the inclination of the detection voltage is large, the arithmetic circuit 5 operates the current value from the wide detection voltage range compared with the case of the small inclination of the detection voltage. In view of this, from the aspect of detection accuracy of the current detection device 100, as the detection voltage range of the arithmetic circuit 5 widens, that is, as the output voltage range of the differential amplifier circuit 3 widens, the operation accuracy of the arithmetic circuit 5 can be enhanced. Expressed in another way, as the maximum output voltage of the differential amplifier circuit 3 is close to the power supply voltage V1 of the arithmetic circuit 5, the operation accuracy of the arithmetic circuit 5 can be enhanced.

The current detection device 100 according to the embodiment can change the characteristic of the detection voltage of the arithmetic circuit 5 to the current If according to the current flowing in the constant current circuit 4. As illustrated in FIG. 2, the smaller the current flowing in the constant current circuit 4 is, the larger the inclination of the detection voltage V to the current If becomes. This indicates that the smaller the current flowing in the constant current circuit 4 is, the larger the differential voltage input to the differential amplifier circuit 3 becomes and the maximum output voltage of the differential amplifier circuit 3 becomes high. That is, the smaller the current flowing in the constant current circuit 4 is, the maximum output voltage of the differential amplifier circuit 3 can be approached to the power supply voltage V1 of the arithmetic circuit 5 and the operation accuracy of the arithmetic circuit 5 can be enhanced.

Figure 3:
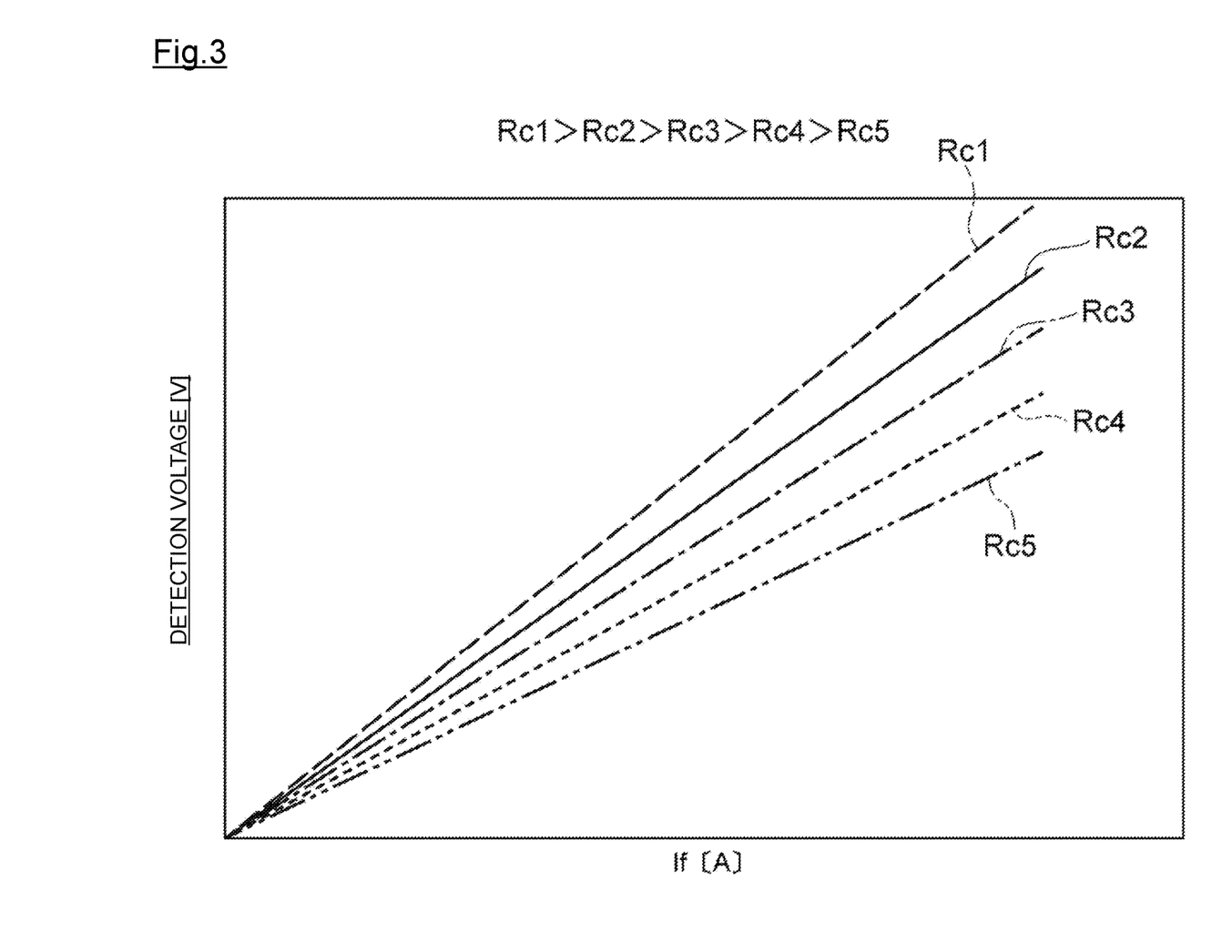
FIG. 3 is characteristics of detection voltages detected by the arithmetic circuit relative to currents flowing through the shunt resistor when a resistance for current adjustment is changed.

FIG. 3 is characteristics of detection voltages detected by the arithmetic circuit 5 relative to currents flowing through the shunt resistor 1 when a resistance value of the resistor 41 is changed. In FIG. 3, the horizontal axis indicates current If flowing in the shunt resistor 1, and the vertical axis indicates the detection voltage detected by the arithmetic circuit 5. In FIG. 3, Rc1 to Rc5 indicate the resistance values of the resistor 41. The resistance values decrease in the order from Rc1 to Rc5.

As in this embodiment, with the use of the resistor 41 as the constant current circuit 4, according to the resistance value of the resistor 41, the characteristic of the detection voltage of the arithmetic circuit 5 relative to the current If can be changed. As illustrated in FIG. 3, the larger the resistance value of the resistor 41 is, the smaller the current flowing in the constant current circuit 4 becomes and the larger the inclination of the detection voltage V relative to the current If becomes. The explanation of FIG. 2 is referred for the relationship between the current flowing through the constant current circuit 4 and the output voltage of the differential amplifier circuit 3. That is, in the current detection device 100 according to the embodiment, as the resistance value of the resistor 41 becomes large, the maximum output voltage of the differential amplifier circuit 3 can be approached to the power supply voltage V1 of the arithmetic circuit 5 and the operation accuracy of the arithmetic circuit 5 can be enhanced.

As described above, the current detection device 100 according to the embodiment includes the shunt resistor 1, the insulation circuit 2, the differential amplifier circuit 3, the constant current circuit 4, and the arithmetic circuit 5. The shunt resistor 1 is connected in series to the path through which the current If flows. The insulation circuit 2 converts the voltage across the shunt resistor 1 into the predetermined differential voltage. To the differential amplifier circuit 3, a differential voltage is input from the insulation circuit 2 via the pair of connection bodies 55, and the differential amplifier circuit 3 amplifies the input differential voltage. The constant current circuit 4 is connected between the pair of connection bodies 55. The arithmetic circuit 5 operates the current If flowing through the path based on the voltage amplified by the differential amplifier circuit 3. Since the constant current circuit 4 can adjust the output voltage range of the differential amplifier circuit 3, the power supply voltage V1 of the differential amplifier circuit 3 can be adjusted to the power supply voltage V1 of the arithmetic circuit 5. Consequently, the detection accuracy of the current can be enhanced without disposing a plurality of types of power supplies having voltages at different heights. Additionally, the number of components can be reduced and a cost can be reduced. Furthermore, the use of the differential amplifier circuit 3 allows improving noise immunity compared with the use of a single-ended amplifier circuit.

In this embodiment, the shunt resistor 1 is disposed in the substrate 51, the insulation circuit 2 is disposed in the substrate 52, and the differential amplifier circuit 3, the constant current circuit 4, and the arithmetic circuit 5 are disposed in the substrate 53. Separating them into the plurality of substrates allows enhancing a degree of freedom of the layout of the current detection device 100. Additionally, for ensuring an insulating property, since the insulation circuit 2, which requires a certain distance in the circuit, is disposed in the independent substrate, compared with a case of constituting the current detection device 100 by one substrate, the insulating property in the insulation circuit 2 is easily ensured.

Furthermore, in this embodiment, the constant current circuit 4 is configured by the resistor 41 connected between the pair of connection bodies 55. Since this allows adjusting the output voltage range of the differential amplifier circuit 3 by the resistance value of the resistor 41, while the power supply voltage V1 of the differential amplifier circuit 3 is adjusted to the power supply voltage V1 of the arithmetic circuit 5, the operation accuracy of the arithmetic circuit 5 can be enhanced.

In addition, in this embodiment, the insulation circuit 2 includes the modulation unit 21 and the demodulation unit 22, and the modulation unit 21 is insulated from the demodulation unit 22. The modulation unit 21 generates the modulation signal produced by modulating the voltage across the shunt resistor 1, and the demodulation unit 22 demodulates the modulation signal modulated by the modulation unit 21 to generate the predetermined differential voltage. Since the modulation unit 21 is electrically insulated from the demodulation unit 22, the power supply voltage of the differential amplifier circuit 3 can be a voltage independent from the voltage applied to the shunt resistor 1. As a result, the power supply voltage V1 of the differential amplifier circuit 3 can be adjusted to the power supply voltage V1 of the arithmetic circuit 5.

Additionally, in this embodiment, the insulation circuit 2 includes the capacitor 23, and the modulation unit 21 is AC coupled to the demodulation unit 22 by the capacitor 23. The modulation unit 21 transmits the alternating current signal to the demodulation unit 22 via the capacitor 23, and the demodulation unit 22 generates the predetermined differential voltage based on the alternating current signal input via the capacitor 23. Since the demodulation unit 22 can operate at a voltage independent from the voltage applied to the shunt resistor 1, the insulation circuit 2 can generate the differential voltage according to the power supply voltage V1 of the differential amplifier circuit 3.

The embodiments described above are described for ease of understanding of the present invention and are not described to limit the present invention. Accordingly, the respective elements disclosed in the above-described embodiments are the gist including all changes of design and their equivalents belonging to the technical scope of the present invention.

For example, in the above-described embodiment, an example of the current detection device 100 configured by the three substrates from the substrate 51 to the substrate 53 has been described, but the current detection device 100 may be configured by two substrates, a substrate 151 (not illustrated) and a substrate 152 (not illustrated). In this case, the shunt resistor 1 and the insulation circuit 2 are disposed in the substrate 151, and the differential amplifier circuit 3, the constant current circuit 4, and the arithmetic circuit 5 are disposed in the substrate 152. A pair of connection bodies 153 (not illustrated) connect between the substrate 151 and the substrate 152. Similar to the above-described embodiment, separating them into the plurality of substrates allows enhancing a degree of freedom of the layout of the current detection device 100. Additionally, since the insulation circuit 2 is disposed in the substrate different from the substrate in which the differential amplifier circuit 3 and the arithmetic circuit 5 are disposed, compared with the case of the current detection device 100 being configured of one substrate, the insulating property in the insulation circuit 2 is easily ensured.

For example, while the alternating current signal is described as an example of the signal transmitted from the modulation unit 21 to the demodulation unit 22 in the above-described embodiment, the signal transmitted from the modulation unit 21 to the demodulation unit 22 is not limited to this.

For example, in a current detection device according to a modification, the insulation circuit 2 includes an insulation transformer. The modulation unit 21 is configured of a primary side coil in the insulation transformer, and the demodulation unit 22 is configured of a secondary side coil in the insulation transformer. The primary side coil includes a modulation circuit that flows the current according to the current If to the primary side coil. The secondary side coil includes a demodulation circuit that generates the differential voltage according to the current flowing through the secondary side coil. When the current flows to the primary side coil by the modulation circuit, a magnetic field occurs around the primary side coil. In the secondary side coil, a current flows by the magnetic field generated in the primary side coil and the demodulation circuit generates the differential voltage according to the current flowing in the secondary side coil. While the modulation unit 21 is electrically insulated from the demodulation unit 22, the insulation circuit 2 may transmit the signal from the modulation unit 21 to the demodulation unit 22 by the principle of electromagnetic induction.

As another example, for example, in a current detection device according to a modification, the insulation circuit 2 includes a photocoupler that converts an electrical signal into an optical signal and converts the optical signal into an electrical signal again. The modulation unit 21 is configured of a light-emitting element that converts an electrical signal into an optical signal in the photocoupler, and the demodulation unit 22 is configured of a light-receiving element that converts an optical signal into an electrical signal in the photocoupler. The light-emitting element includes a modulation circuit that flows a current according to the current If to the light-emitting element. The light-receiving element includes a demodulation circuit that generates a differential voltage according to a current flowing through the light-receiving element. When the currents flows through the light-emitting element by the modulation circuit, the light-emitting element emits light according to the current. In the light-receiving element, the current flows according to the light emission of the light-emitting element, and the demodulation circuit generates the differential voltage according to the current flowing through the light-receiving element. The insulation circuit 2 may transmit the optical signal from the modulation unit 21 to the demodulation unit 22 with the modulation unit 21 electrically insulated from the demodulation unit 22.

In the above-described embodiment, the resistor 41 connected between the connection bodies 55 has been described as an example of the constant current circuit 4, the circuit configuration of the constant current circuit 4 is not limited to the resistor. For example, the constant current circuit 4 may be configured of a circuit using a transistor (such as a current mirror circuit). Additionally, the resistor 41 is not limited to the resistor whose resistance value is fixed, and may be a variable resistor whose resistance value is changeable.

While in the above-described embodiment, from the aspect of the output voltage range of the differential amplifier circuit 3, it has been described that as the current flowing through the constant current circuit 4 decreases, the operation accuracy of the arithmetic circuit 5 is enhanced. However, from the aspect of noise immunity, as the current flowing through the constant current circuit 4 increases, the operation accuracy of the arithmetic circuit 5 is enhanced. That is, the larger the current flowing through the constant current circuit 4 is, the more noise immunity of the differential wiring of the differential amplifier circuit 3 can be achieved. Accordingly, a possibility of generating an error in the output voltage of the differential amplifier circuit 3 due to a noise can be reduced. Consequently, the operation accuracy of the arithmetic circuit 5 can be increased. In the present invention, from the aspect of the output voltage range of the differential amplifier circuit 3 and noise immunity, the current flowing through the constant current circuit 4 is preferably set.

In the above-described embodiment, while the shunt resistor 1 has been described as an example of the "shunt resistor" of the present invention, the "shunt resistor" of the present invention is not limited to the shunt resistor 1. While the insulation circuit 2 has been described as an example of the "first circuit" of the present invention, the "first circuit" of the present invention is not limited to the insulation circuit 2. While the differential amplifier circuit 3 has been described as an example of the "second circuit" of the present invention, the "second circuit" of the present invention is not limited to the differential amplifier circuit 3. While the constant current circuit 4 has been described as an example of the "constant current circuit" of the present invention, the "constant current circuit" of the present invention is not limited to the constant current circuit 4. While the arithmetic circuit 5 has been described as an example of the "arithmetic circuit" of the present invention, the "arithmetic circuit" of the present invention is not limited to the arithmetic circuit 5.

DESCRIPTION OF REFERENCE SIGNS

1 . . . Shunt resistor
2 . . . Insulation circuit
21 . . . Modulation unit
22 . . . Demodulation unit
23 . . . Capacitor
3 . . . Differential amplifier circuit
31a, 31b . . . Input terminal
4 . . . Constant current circuit
41 . . . Resistor
5 . . . Arithmetic circuit
6, 7 . . . Input resistor
8 . . . Operational amplifier
51 . . . Substrate
52 . . . Substrate
53 . . . Substrate
54 . . . Connection body
54a, 54b . . . Connection body
55 . . . Connection body
55a, 55b . . . Connection body
100 . . . Current detection device

The invention claimed is:

1. A current detection device comprising:
a shunt resistor connected in series to a path through which a current flows;
a first circuit that converts a voltage across the shunt resistor into a predetermined differential voltage;
a second circuit to which the predetermined differential voltage is input from the first circuit via a pair of wirings, the second circuit amplifying the predetermined differential voltage;
a constant current circuit connected between the pair of wirings; and
an arithmetic circuit that operates the current flowing through the path based on the voltage amplified by the second circuit,
wherein the constant current circuit adjusts an output voltage range of the second circuit.

2. The current detection device according to claim 1, wherein
the shunt resistor is disposed in a first substrate,
the first circuit is disposed in a second substrate, and
the second circuit, the constant current circuit, and the arithmetic circuit are disposed in a third substrate.

3. The current detection device according to claim 1, wherein
the shunt resistor and the first circuit are disposed in a first substrate, and
the second circuit, the constant current circuit, and the arithmetic circuit are disposed in a second substrate.

4. The current detection device according to claim 1, wherein
the constant current circuit is formed of a resistor connected between the pair of wirings.

5. The current detection device according to claim 1, wherein
the first circuit includes a modulation unit and a demodulation unit,
the modulation unit is insulated from the demodulation unit,
the modulation unit generates a modulation signal produced by modulating the voltage across the shunt resistor, and
the demodulation unit demodulates the modulation signal to generate the predetermined differential voltage.

6. The current detection device according to claim 5, wherein
the first circuit includes a capacitor,
the modulation unit is AC coupled to the demodulation unit by the capacitor,
the modulation unit transmits the modulation signal to the demodulation unit via the capacitor, and
the demodulation unit generates the predetermined differential voltage based on the modulation signal input via the capacitor.

7. The current detection device according to claim 5, wherein
the first circuit includes an insulation transformer,
the modulation unit is configured of a primary side coil in the insulation transformer, and
the demodulation unit is configured of a secondary side coil in the insulation transformer.

8. The current detection device according to claim 5, wherein
the first circuit includes a photocoupler,
the modulation unit is configured of a light-emitting element in the photocoupler, and
the demodulation unit is configured of a light-receiving element in the photocoupler.

9. A current detection method for detecting a current flowing through a path, the current detection method comprising:
converting a voltage across a shunt resistor connected in series to the path into a predetermined differential voltage in a first circuit;
flowing a current between a pair of wirings connected between the first circuit and a second circuit using a constant current circuit;
amplifying the differential voltage input from the first circuit via the pair of wirings in the second circuit;
operating the current flowing through the path based on the voltages amplified by the second circuit in an arithmetic circuit; and
adjusting an output voltage range of the second circuit by the constant current circuit.

10. A current detection device comprising:
a shunt resistor connected in series to a path through which a current flows;
a first circuit that converts a voltage across the shunt resistor into a predetermined differential voltage;
a second circuit to which the predetermined differential voltage is input from the first circuit via a pair of wirings, the second circuit amplifying the predetermined differential voltage;
a constant current circuit connected between the pair of wirings; and an arithmetic circuit that operates the current flowing through the path based on the voltage amplified by the second circuit,
wherein the constant current circuit is formed of a resistor connected between the pair of wirings.

11. The current detection device according to claim 10, wherein the resistor is a variable resistor.

12. The current detection device according to claim 10, wherein the resistor is connected only to the pair of wirings.

13. A current detection device comprising:
a shunt resistor connected in series to a path through which a current flows;
a first circuit that converts a voltage across the shunt resistor into a predetermined differential voltage;
a second circuit to which the predetermined differential voltage is input from the first circuit via a pair of wirings, the second circuit amplifying the predetermined differential voltage;
a constant current circuit connected between the pair of wirings; and
an arithmetic circuit that operates the current flowing through the path based on the voltage amplified by the second circuit, wherein
the first circuit includes a modulation unit and a demodulation unit,
the modulation unit is insulated from the demodulation unit,
the modulation unit generates a modulation signal produced by modulating the voltage across the shunt resistor, and
the demodulation unit demodulates the modulation signal to generate the predetermined differential voltage.

14. The current detection device according to claim 13, wherein
the first circuit includes a capacitor,
the modulation unit is AC coupled to the demodulation unit by the capacitor,
the modulation unit transmits the modulation signal to the demodulation unit via the capacitor, and
the demodulation unit generates the predetermined differential voltage based on the modulation signal input via the capacitor.

15. The current detection device according to claim 13, wherein
the first circuit includes an insulation transformer,
the modulation unit is configured of a primary side coil in the insulation transformer, and
the demodulation unit is configured of a secondary side coil in the insulation transformer.

16. The current detection device according to claim 13, wherein
the first circuit includes a photocoupler,
the modulation unit is configured of a light-emitting element in the photocoupler, and the demodulation unit is configured of a light-receiving element in the photocoupler.

* * * * *